(12) United States Patent
LoBianco et al.

(10) Patent No.: US 11,563,267 B2
(45) Date of Patent: *Jan. 24, 2023

(54) METHODS FOR ELECTROMAGNETIC SHIELDING USING AN OUTER COBALT LAYER

(71) Applicant: Skyworks Solutions, Inc., Irvine, CA (US)

(72) Inventors: Anthony James LoBianco, Irvine, CA (US); Hoang Mong Nguyen, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/303,135

(22) Filed: May 20, 2021

(65) Prior Publication Data

US 2021/0336332 A1    Oct. 28, 2021

Related U.S. Application Data

(63) Continuation of application No. 16/449,843, filed on Jun. 24, 2019, now Pat. No. 11,038,267.
(Continued)

(51) Int. Cl.
*H05K 1/02* (2006.01)
*H05K 3/30* (2006.01)
(Continued)

(52) U.S. Cl.
CPC .......... *H01Q 1/526* (2013.01); *H01L 23/3121* (2013.01); *H01L 23/552* (2013.01);
(Continued)

(58) Field of Classification Search
None
See application file for complete search history.

(56) References Cited

U.S. PATENT DOCUMENTS

| 5,561,265 A | 10/1996 | Livshits |
| 7,109,410 B2 | 9/2006 | Arnold |

(Continued)

FOREIGN PATENT DOCUMENTS

WO    WO 2018/119153 A2    6/2018

OTHER PUBLICATIONS

International Search Report and Written Opinion received in International Patent Application No. PCT/US2019/040415, dated Oct. 25, 2019.

*Primary Examiner* — Tuan A Tran
(74) *Attorney, Agent, or Firm* — Knobbe, Martens, Olson & Bear LLP (57) ABSTRACT

A method for providing electromagnetic shielding of a semiconductor die includes attaching a semiconductor die to a package substrate of a packaged radio frequency module, where the package substrate includes one or more radio frequency circuits fabricated therein. The method also includes encapsulating the semiconductor die with a molding compound. The method also includes at least partially covering the molding compound with an electromagnetic shielding structure having an outer layer including cobalt. A phone board assembly can include the packaged radio frequency module attached to a printed circuit board. The packaged radio frequency module can be incorporated into a mobile device.

23 Claims, 7 Drawing Sheets

Related U.S. Application Data (60) Provisional application No. 62/712,417, filed on Jul. 31, 2018.

(51) Int. Cl.
*H01L 23/00* (2006.01)
*H01L 23/552* (2006.01)
*H01Q 1/52* (2006.01)
*H01L 23/31* (2006.01)
*H01Q 1/38* (2006.01)
*H01Q 1/24* (2006.01)
*H04B 1/3883* (2015.01)
*H04W 52/02* (2009.01)
*H01Q 1/22* (2006.01)

(52) U.S. Cl.
CPC ........... *H01Q 1/2283* (2013.01); *H01Q 1/243* (2013.01); *H01Q 1/38* (2013.01); *H04B 1/3883* (2013.01); *H04W 52/0296* (2013.01)

(56) References Cited

U.S. PATENT DOCUMENTS

| | | | |
|---|---|---|---|
| 7,443,693 B2 | 10/2008 | Arnold | |
| 7,482,686 B2 * | 1/2009 | Zhao | H01L 23/24 257/687 |
| 7,488,901 B2 * | 2/2009 | Arnold | H05K 9/0024 174/377 |
| 7,642,136 B2 * | 1/2010 | Hooi | H01L 23/552 438/118 |
| 8,110,902 B2 | 2/2012 | Eun | |
| 9,006,889 B2 | 4/2015 | Joshi | |
| 9,054,115 B2 | 6/2015 | Hoang | |
| 9,337,153 B2 | 5/2016 | Fu | |
| 9,508,657 B2 | 11/2016 | Lee | |
| 10,049,961 B1 * | 8/2018 | Qi | H01L 23/3677 |
| 10,074,614 B2 | 9/2018 | Gong | |
| 10,141,271 B1 * | 11/2018 | Xu | H01L 23/66 |
| 10,163,867 B2 * | 12/2018 | Kim | H01L 25/0652 |
| 10,381,313 B2 * | 8/2019 | Kim | H01L 24/85 |
| 10,497,650 B2 * | 12/2019 | Kim | H01L 24/46 |
| 11,038,267 B2 | 6/2021 | LoBianco et al. | |
| 2005/0045358 A1 | 3/2005 | Arnold | |
| 2006/0272856 A1 | 12/2006 | Arnold | |
| 2006/0272857 A1 | 12/2006 | Arnold | |
| 2009/0294930 A1 | 12/2009 | Yoon | |
| 2011/0084378 A1 | 4/2011 | Welch et al. | |
| 2016/0276288 A1 | 9/2016 | Lee et al. | |
| 2017/0025363 A1 * | 1/2017 | Tsai | H01L 23/3114 |
| 2017/0200682 A1 | 7/2017 | Lin et al. | |
| 2018/0228016 A1 * | 8/2018 | Kim | H05K 3/4038 |
| 2018/0323170 A1 * | 11/2018 | Kim | H01L 25/0652 |

\* cited by examiner

METHODS FOR ELECTROMAGNETIC SHIELDING USING AN OUTER COBALT LAYER

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57 and should be considered a part of this specification.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz.

Examples of RF communication systems include, but are not limited to, mobile phones, tablets, base stations, network access points, customer-premises equipment (CPE), laptops, and wearable electronics.

SUMMARY

In accordance with one aspect of the disclosure, a packaged radio frequency module is provided. The packaged radio frequency module comprises a package substrate and at least one semiconductor die attached to the package substrate and including one or more radio frequency circuits. A molding compound encapsulates the at least one semiconductor die. An electromagnetic shielding structure at least partially covers the molding compound, the electromagnetic shielding structure having an outer layer including cobalt.

In accordance with another aspect of the disclosure, a phone board assembly is provided that comprises a printed circuit board and a packaged radio frequency module attached to the printed circuit board. The radio frequency module comprises a package substrate and at least one semiconductor die attached to the package substrate and including one or more radio frequency circuits. An electromagnetic shielding structure at least partially encloses the at least one semiconductor die, the electromagnetic shielding structure having an outer layer including cobalt.

In accordance with another aspect of the invention, a mobile device is provided. The mobile device comprises a transceiver configured to generate a radio frequency transmit signal and to receive a radio frequency receive signal. The mobile device also comprises a front end system configured to process the radio frequency transmit signal from the transceiver and to provide the transceiver with the radio frequency receive signal. The front end system includes a packaged radio frequency module including a package substrate. At least one semiconductor die is attached to the package substrate and includes one or more radio frequency circuits. An electromagnetic shielding structure at least partially encloses the at least one semiconductor die, the electromagnetic shielding structure having an outer layer including cobalt.

In accordance with another aspect of the disclosure, a radio frequency module is provided. The module comprises a semiconductor die including one or more radio frequency circuits fabricated therein, and an electromagnetic shielding structure at least partially enclosing the semiconductor die, the electromagnetic shielding structure having an outer layer including cobalt.

In accordance with another aspect of the disclosure, a method of forming a packaged radio frequency module is provided. The method comprises the steps of: attaching at least one semiconductor die to a package substrate, the at least one semiconductor die including one or more radio frequency circuits, encapsulating the at least one semiconductor die in a molding compound, and forming an electromagnetic shielding structure over the molding compound, including providing cobalt in an outer layer of the electromagnetic shielding structure.

In accordance with another aspect of the disclosure, a method of shielding a radio frequency component is provided. The method comprises forming an electromagnetic shielding structure over a semiconductor die, said forming step including providing cobalt in an outer layer of the electromagnetic shielding structure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Figure 1:
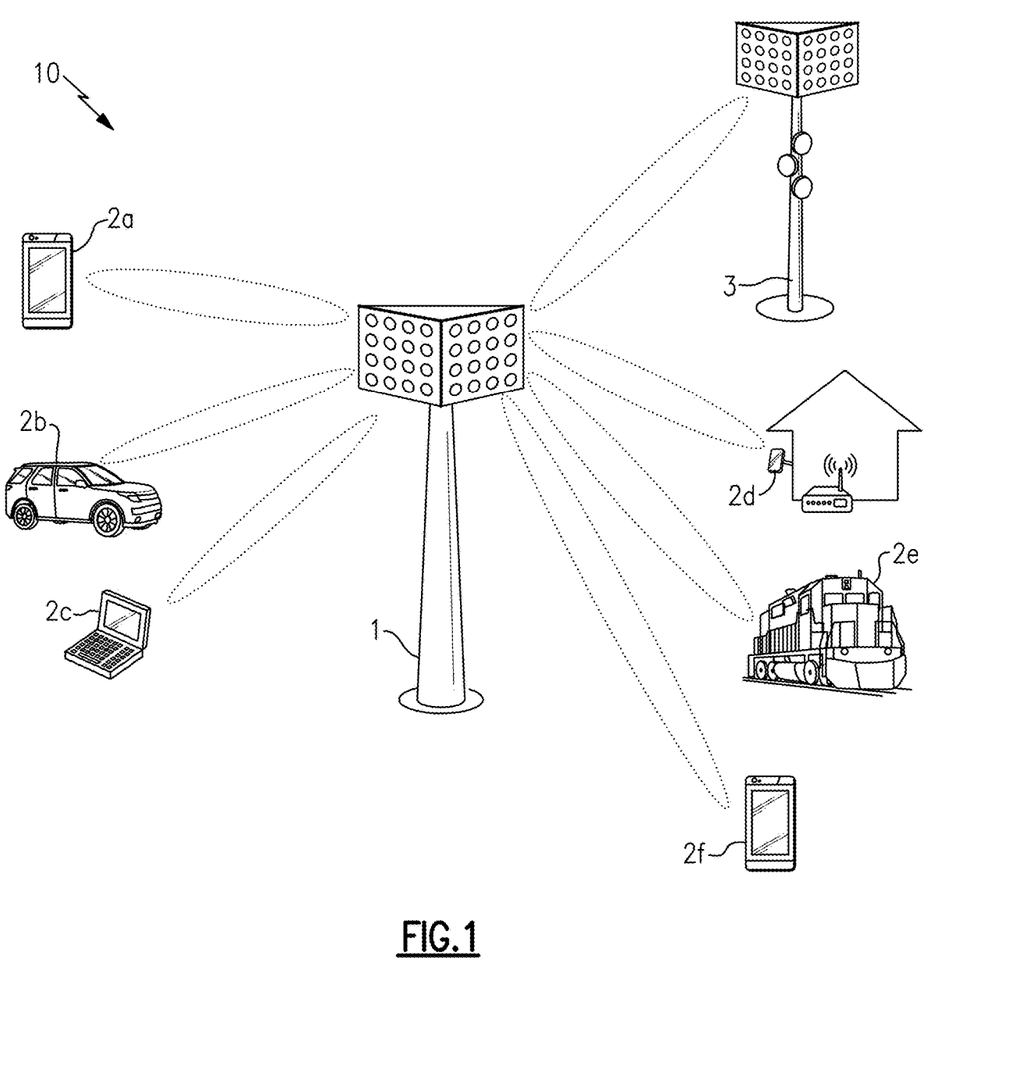
FIG. 1 is a schematic diagram of one example of a communication network.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2:
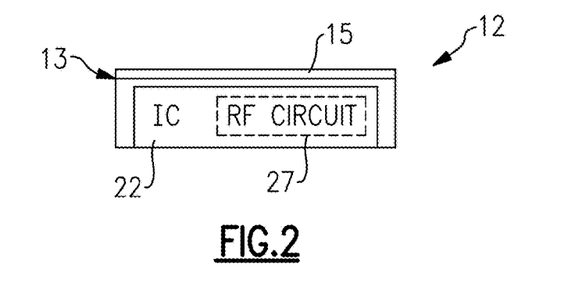
FIG. 2 is a schematic diagram of a packaged radio frequency (RF) component according to one embodiment.

FIG. 2 is a schematic diagram of a packaged RF component 12 according to one embodiment. The packaged RF component 12 includes a semiconductor die or integrated circuit (IC) 22. Additionally, the packaged RF component 12 includes an electromagnetic shielding structure 13 that partially encloses the IC 22 and that includes an outer layer 15 including cobalt.

Although one example of a packaged RF component is shown in FIG. 2, the teachings herein are applicable to packaged RF components and modules implemented in a wide variety of ways.

In the illustrated embodiment, the outer layer 15 extends over a top surface of the IC 22, and does not extend along the sides of the electromagnetic shielding structure 13. However, other implementations are possible, such as configurations in which the outer layer 15 also extends along at least one side of the electromagnetic shielding structure 13.

The IC 22 includes an RF circuit 27, which can be implemented in a wide variety of ways. For example, the RF circuit 27 can include one or more RF amplifiers, RF filters, RF switches, and/or other RF circuitry. Although the IC 22 is illustrated as including one RF circuit, the IC 22 can include additional RF circuits as well as other structures and/or circuits, including, but not limited to, analog and/or digital circuitry.

The electromagnetic shielding structure 13 operates to provide electromagnetic shielding to the RF circuit 27. For example, the electromagnetic shielding structure 13 can operate as a Faraday cage, thereby inhibiting or attenuating propagation of electromagnetic waves. As persons having ordinary skill in the art will appreciate, an electromagnetic shield need not fully block electromagnetic energy, but rather can reduce or attenuate electromagnetic fields over one or more frequency ranges.

The electromagnetic shielding structure 13 includes the outer layer 15, which includes cobalt. By including an outer layer of cobalt, a number of advantages can be achieved.

For example, cobalt can provide electromagnetic shielding at certain frequency ranges. In certain implementations, an outer cobalt layer provides shielding over a frequency range that includes at least 1 megahertz (MHz) to 5 MHz, or more particularly, at least 100 kilohertz (kHz) to 5 MHz. Providing electromagnetic shielding in this frequency range can provide a number of advantages, including, but not limited to, shielding the RF circuit 27 from electromagnetic emissions from a wireless charging circuit.

In contrast certain conventional electromagnetic shielding structures may not shield at a low end of radio frequency spectrum, for instance, at frequencies less than about 5 MHz.

Certain electromagnetic shielding structures herein include one or more inner layers for providing electromagnetic shielding over one or more high frequency ranges, and an outer cobalt layer that provides electromagnetic shield over a lower frequency range, for instance, a frequency range covering at least 1 MHz to 5 MHz, and more particularly 100 kHz to 5 MHz. By implementing the electromagnetic shielding structure in this manner, wideband shielding of electromagnetic energy is achieved.

By implemented an RF communication device using packaged RF components and/or modules that include electromagnetic shielding structures with wideband shielding provides a number of benefits, including, but not limited to, an ability to transmit and/or receive RF signals in noisy radio environments, over greater distances, and/or while a battery of the RF communication device is being wirelessly charged.

Including cobalt in the outer layer 15 also can provide the packaged RF component 12 with a blue color. For instance, in certain implementations, the outer layer 15 presents as a blue color, such as a red-green-blue (RGB) value including a red component of about 0, a green component of about 71, and a blue component of about 171. However, the outer layer 15 can present other colors.

The blue color can provide a number of benefits. For example, in certain implementations, high performance parts, such as those complying with a particular communication standard (for instance, 5G), are implemented with an electromagnetic shielding having an outer layer of cobalt for enhanced performance.

Such blue color RF components and modules can be easily identified by sight, not only during manufacture, assembly, and/or test, but also after inclusion in an RF communication device (for instance, on a circuit board). For example, the blue color can provide contrast, to black, grey, and/or silver components typically associated with electronics.

Moreover, when manufacturing certain RF communication devices, such as mobile phones, multiple RF components or modules can be placed on a tape, which in turn can be placed on a reel for facilitating assembly line manufacturing. The blue color can readily distinguish a tape and reel including components or modules shielded with an outer cobalt layer from the tape and reel of other RF components or modules, thereby reducing operator error.

The outer layer 15 can be formed in a wide variety of ways, including, but not limited to, using sputtering. In certain implementations, the outer layer 15 is formed substantially of cobalt. In another embodiment, the outer layer 15 includes at least fifty percent cobalt by mass, or more particularly, at least ninety percent cobalt by mass.

Figure 3A:
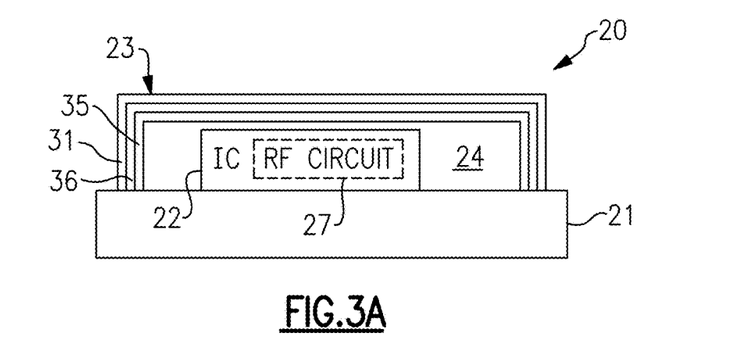
FIG. 3A is a schematic diagram of a packaged RF module according to one embodiment.

FIG. 3A is a schematic diagram of a packaged RF module 20 according to one embodiment. The packaged RF component 20 includes a package substrate 21, a semiconductor die or IC 22, an electromagnetic shielding structure 23, and a molding compound 24.

As shown in FIG. 3A, the semiconductor die 22 is attached to package substrate 21, and the molding compound 24 encapsulates the semiconductor die 22. Although an example with one IC attached to the package substrate is shown, the IC can include multiple dies and/or other components (including, but not limited to, surface mount devices, integrated passive devices, and/or or filters) integrated on and/or within the package substrate 21.

The electromagnetic shielding structure 23 partially covers the molding compound 24, and includes an outer layer 31 that includes cobalt. In this embodiment, the outer layer 31 extends both along the top of the IC 22, as well as laterally around a perimeter of the IC 22. Thus, the electromagnetic shielding structure 23 serves as a lid that encloses the IC 22 when the lid is positioned against the package substrate 21. Although another example of an electromagnetic shielding structure is shown in FIG. 3A, the teachings herein are applicable to electromagnetic shielding structures implemented in a wide variety of ways.

The illustrated electromagnetic shielding structure 23 includes multiple layers, including not only the outer layer 31, but also a first inner layer 35 and a second inner layer 36. As shown in FIG. 3A, the second inner layer 36 is positioned between the first inner layer 35 and the outer layer 31. Although a three layer electromagnetic shielding structure is shown, an electromagnetic shielding structure can include more or fewer layers.

The first inner layer 35 and the second inner layer 36 can be implemented in a wide variety of ways. In a first example, the first inner layer 35 includes titanium and the second inner layer 36 includes copper. In a second example, the first inner layer 35 includes cobalt and the second inner layer 36 includes copper. Including one or more inner cobalt layers can provide a number of benefits, such as superior electromagnetic shielding in a low frequency RF range and/or reduced cost or time of manufacture by reducing changes and/or retooling of manufacturing apparatus (for instance, sputtering equipment).

Figure 3B:
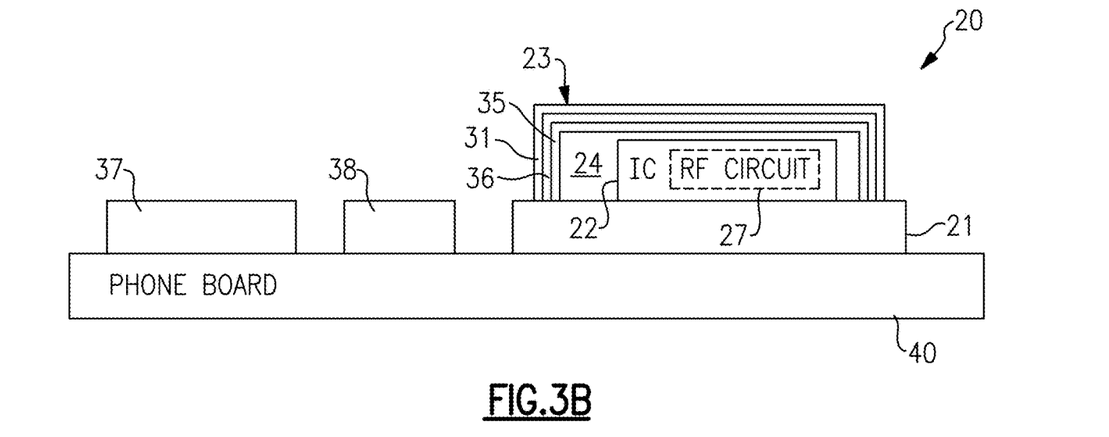
FIG. 3B is a schematic diagram of a phone board according to one embodiment.

FIG. 3B is a schematic diagram of a phone board 40 according to one embodiment. The phone board 40 includes an RF module 20 attached thereto. The packaged RF module 20 can be as described above with respect to FIG. 3A. The phone board 40 further includes additional RF components 37, 38. Although two additional RF components are shown, the phone board 40 can include a wide variety of structures attached thereto, including but not limited to, additional RF components.

The electromagnetic shielding structure 23 of the packaged RF module 22 includes the outer layer 31, which includes cobalt. In certain implementations, the outer layer 31 presents a blue color to thereby distinguish the packaged RF module 22 from the RF components 37, 38 and/or one or more other RF components or modules attached to the phone board 40. Thus, not only does the outer cobalt layer provide enhanced electromagnetic shielding performance, but also aids in distinguishing the packaged RF module 22 from other circuitry, thereby aiding in manufacture, testing, and/or repair of the phone board 40.

In certain implementations, the phone board 40 includes a wireless charging circuit, and the outer layer 31 of the electromagnetic shielding structure 23 operates to shield the RF circuit 27 from electromagnetic emissions of the wireless charging circuit.

Figure 4A:
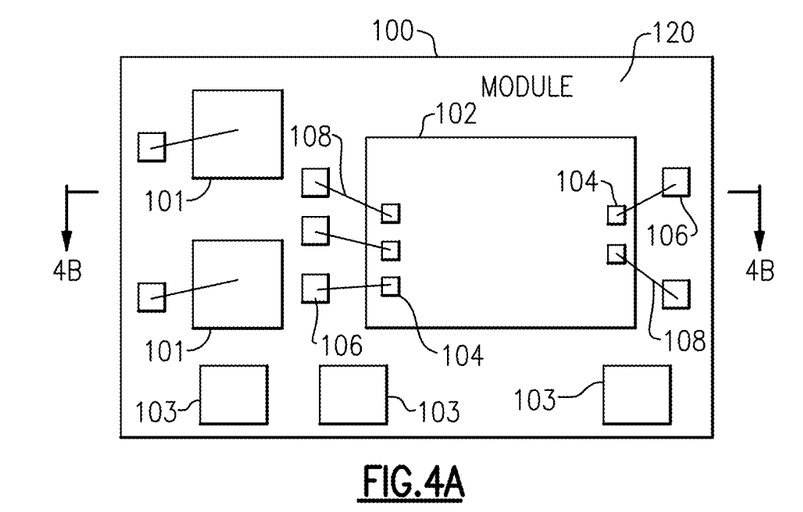
FIG. 4A is a plan view of one embodiment of a packaged RF module.
Figure 4B:
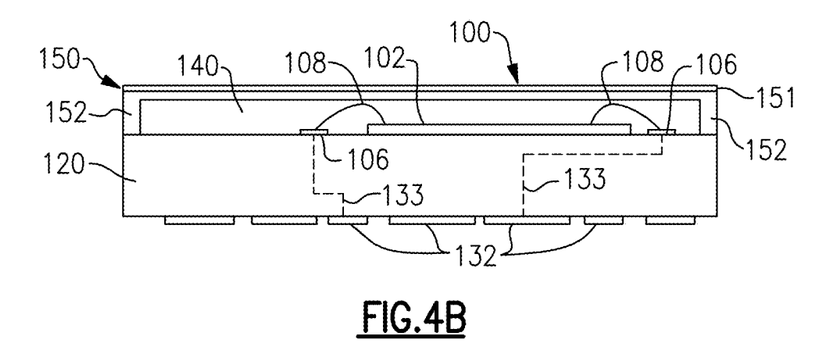
FIG. 4B is a schematic diagram of a cross-section of the packaged RF module of FIG. 4A taken along the lines 4B-4B.

FIG. 4A is a plan view of one embodiment of a packaged RF module 100. FIG. 4B is a schematic diagram of a cross-section of the packaged RF module 100 of FIG. 4A taken along the lines 4B-4B.

Certain implementations of the RF communication systems herein include one or more packaged RF modules, such as the packaged RF module 100. Although the packaged RF module 100 of FIGS. 4A and 4B illustrates one example implementation of a module suitable for use in an RF communication system, other implementations of modules are possible.

The packaged RF module 100 includes radio frequency components 101, a semiconductor die 102, surface mount devices 103, wirebonds 108, a package substrate 120, encapsulation structure or molding compound 140, and an electromagnetic shielding structure 150. The package substrate 120 includes pads 106 formed from conductors disposed therein. Additionally, the semiconductor die 102 includes pins or pads 104, and the wirebonds 108 have been used to connect the pads 104 of the die 102 to the pads 106 of the package substrate 120.

As shown in FIG. 4B, the packaged RF module 100 is shown to include a plurality of contact pads 132 disposed on the side of the packaged RF module 100 opposite the side used to mount the semiconductor die 102. Configuring the packaged RF module 100 in this manner can aid in connecting the packaged RF module 100 to a circuit board, such as a phone board of a wireless device. The example contact pads 132 can be configured to provide radio frequency signals, bias signals, and/or power (for example, a power supply voltage and ground) to the semiconductor die 102. As shown in FIG. 4B, the electrical connections between the contact pads 132 and the semiconductor die 102 can be facilitated by connections 133 through the package substrate 120. The connections 133 can represent electrical paths formed through the package substrate 120, such as connections associated with vias and conductors of a multilayer laminated package substrate.

The packaged RF module 100 also includes the molding compound or encapsulation structure 140 formed over the packaging substrate 120 and the components and die(s) disposed thereon.

It will be understood that although the packaged RF module 100 is described in the context of electrical connections based on wirebonds, one or more features of the present disclosure can also be implemented in other packaging configurations, including, for example, flip-chip configurations.

With continuing reference to FIGS. 4A and 4B, the packaged RF module 100 further includes the electromagnetic shielding structure 150, which includes an outer layer 151 that includes cobalt. In this embodiment, the outer cobalt layer 151 does not extend along the sides 152 of the electromagnetic shielding structure 150. However, other implementations are possible. In certain implementations, the sides 152 includes a plurality of wire bonds that operate to fence or cage a perimeter of the semiconductor die 102.

Figure 5:
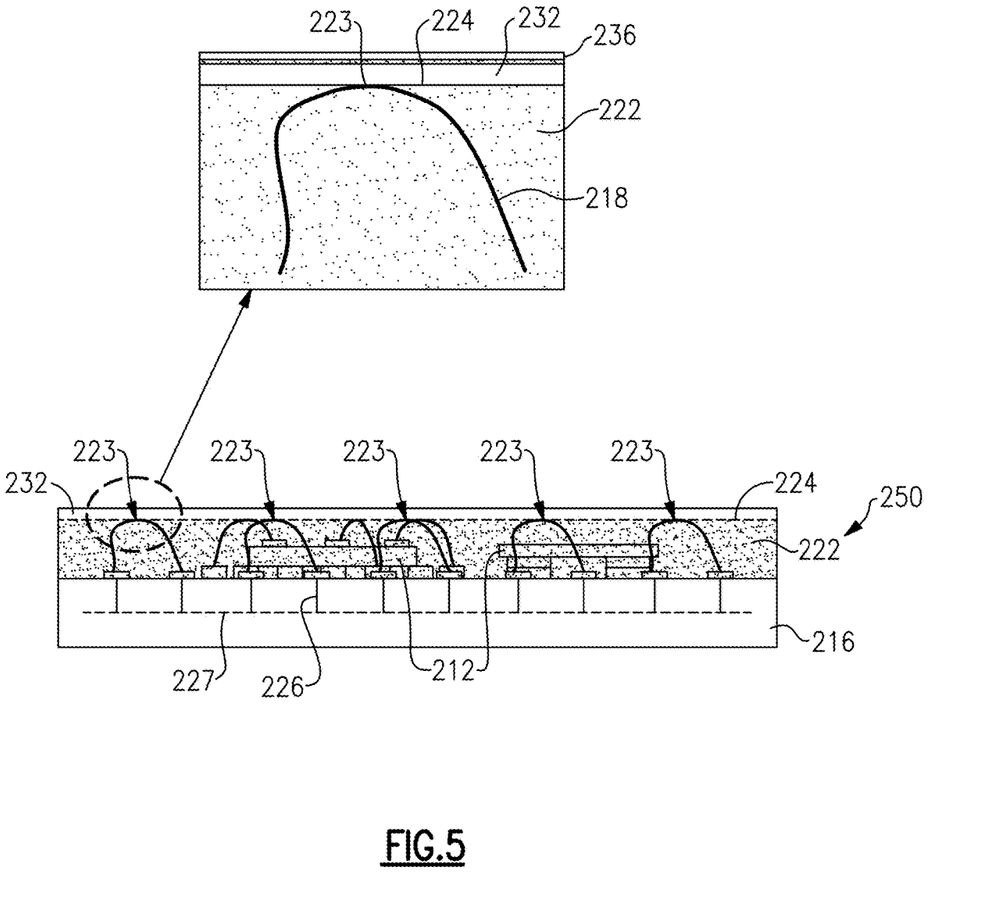
FIG. 5 is a cross-section of another embodiment of a packaged RF module.

FIG. 5 is a cross-section of another embodiment of a packaged RF module 250.

As illustrated in FIG. 5, a molding material or compound 222 can be disposed over one or more RF components 212 (for instance, semiconductor dies of the same or different processing technology), and the wire bonds 218. In FIG. 5, upper portions 223 of wire bonds 218 can extend above upper surface 224 of an overmold structure of the molding material 222 that is over the wire bonds 218. Thus, the wire bonds 218 can be exposed by removing molding material after forming an overmold structure of the molding material 222. Having the upper portions 223 of the wire bonds 218 exposed as shown in FIG. 5 can allow a conductive structure 232 over the molding material 222 to be in contact with the wire bonds 218 to thereby provide an electrical connection.

As shown in FIG. 5, the conductive structure 232 includes an outer layer 236. The conductive structure 232 operates in combination with the wire bonds 218 as an electromagnetic shielding structure to the RF components 212.

With continuing reference to FIG. 5, vias 226 are included in the package substrate 216. The wire bonds 218 can be electrically connected to a ground plane 227 of the package substrate 216 by way of the vias 226. The wire bonds 218 can be electrically connected to a ground contact of a system board on which the module 250 is disposed by way of the vias 226.

Accordingly, in certain implementations herein, an electromagnetic shielding structure including an outer cobalt layer is grounded.

Figure 6:
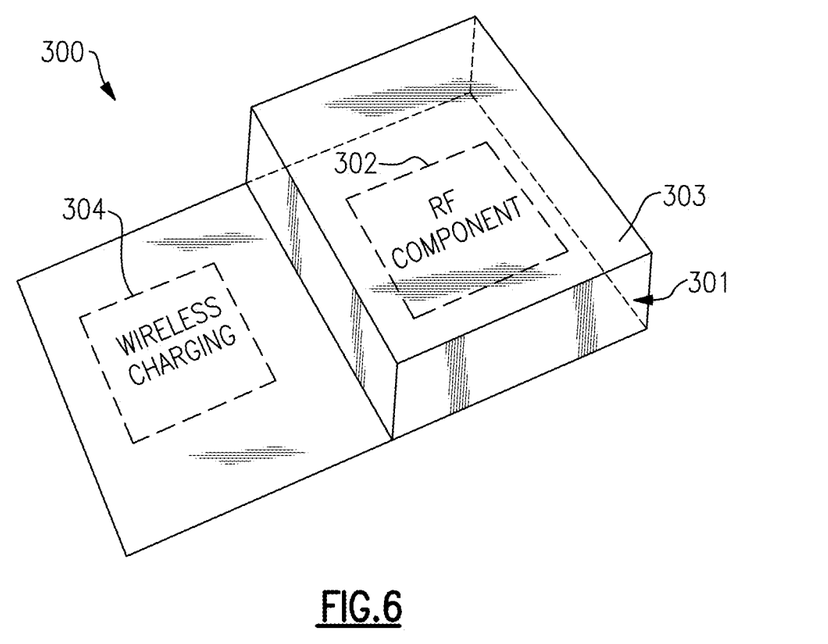
FIG. 6 is a front perspective view of one embodiment of another embodiment of a phone board.

FIG. 6 is a front perspective view of one embodiment of another embodiment of a phone board 300. The phone board 300 includes a packaged RF component 301 and a wireless charging circuit 304 thereon.

The packaged RF component 301 includes an RF component 302 and an electromagnetic shielding structure 303 at least partially enclosing the RF component 302. The electromagnetic shielding structure 303 includes an outer cobalt layer over at least a portion of the electromagnetic shielding structure 303.

By including the outer cobalt layer, the RF component 302 is shielded from electromagnetic emissions of the wireless charging circuit 304.

Figure 7:
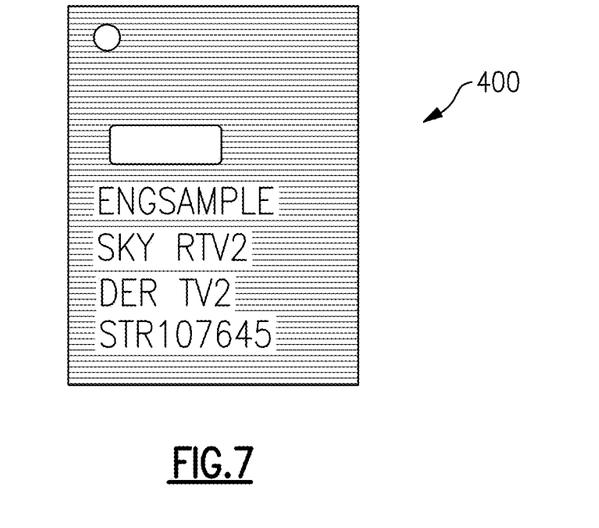
FIG. 7 is a plan view of another embodiment of a packaged RF component.

FIG. 7 is a plan view of another embodiment of a packaged RF component 400. The packaged RF component includes an electromagnetic shielding structure including an outer cobalt layer.

Figure 8:
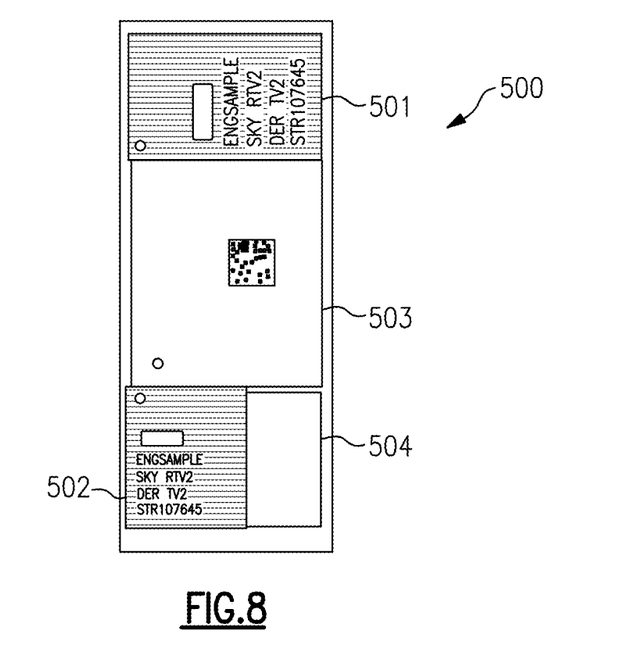
FIG. 8 is a plan view of another embodiment of a phone board.

FIG. 8 is a plan view of another embodiment of a phone board 500. The phone board 500 includes a first packaged RF component 501, a second packaged RF component 502, a third packaged RF component 503, and a fourth packaged RF component 504 thereon.

The first and second packaged RF components 501, 502 include an electromagnetic shielding structure including an outer cobalt layer. In contrast, the third and fourth packaged RF components 503, 504 omit an outer cobalt layer.

As shown in FIG. 8, including cobalt in the outer layer also can provide the packaged RF components 501, 502 with a blue color. The blue color can provide a number of benefits. For example, in certain implementations, high performance parts, such as those complying with a particular communication standard (for instance, 5G), are implemented with an electromagnetic shielding having an outer layer of cobalt for enhanced performance.

Such blue color RF components and modules can be easily identified by sight, not only during manufacture, assembly, and/or test, but also after inclusion in an RF communication device (for instance, on a circuit board). For example, the blue color can provide contrast, to black, grey, and/or silver components (for instance, packaged RF components 503, 504) typically associated with electronics.

Moreover, when assembling certain RF communication devices, such as mobile phones, multiple RF components or modules can be placed on a tape, which in turn can be placed on a reel. The blue color can readily distinguish a tape and reel including components or modules shielded with an outer cobalt layer from the tape and reel of other RF components or modules, thereby reducing operator error.

Figure 9:
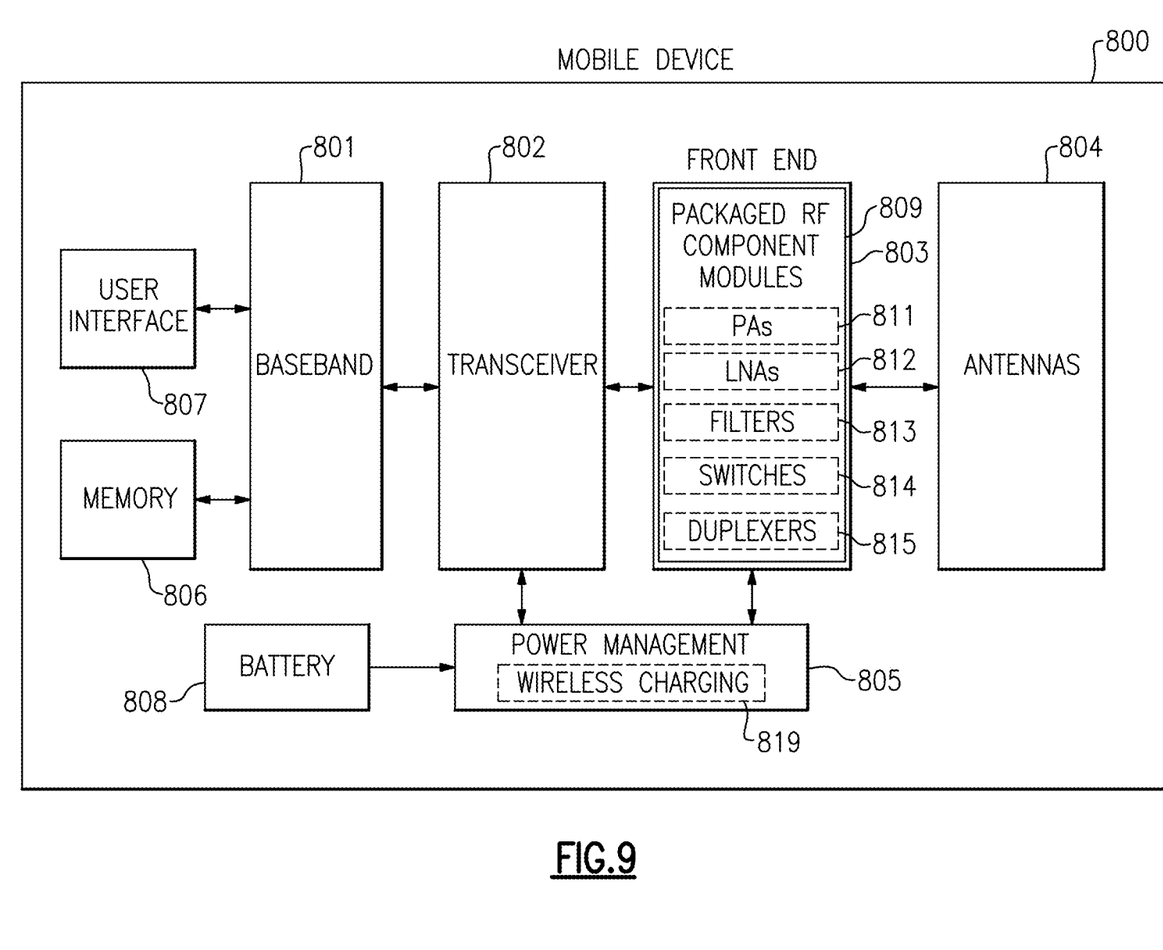
FIG. 9 is a schematic diagram of one embodiment of a mobile device.

FIG. 9 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes one or more packaged RF components and/or modules 809 implemented in accordance with the teachings herein. The one or more packaged RF components/modules 809 can include one or more power amplifiers (PAs) 811, one or more low noise amplifiers (LNAs) 812, one or more filters 813, one or more RF switches 814, one or more duplexers 815, and/or other circuitry fabricated thereon. Although various examples of RF circuitry for packaged RF components/modules has been described, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 to facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In the illustrated embodiment, the power management circuit 805 include a wireless charging circuit 819, which is operable to charge the battery 808 in response to an electromagnetic field from a charging station (not shown in FIG. 9).

In certain implementations, at least one of the packaged RF components/modules 809 includes an outer layer including cobalt. Additionally, the outer layer is configured to shield the radio frequency circuits therein from electromagnetic emissions of the wireless charging circuit 819.

By implementing one or more of the packaged RF components/modules 809 with an outer layer that includes cobalt, wideband shielding of the RF circuitry can be achieved. For example, electromagnetic shielding can be provided at frequencies associated with emissions of the wireless charging circuit 819, including, but not limited to, frequencies in the range of about 100 Khz to about 5 MHz. Thus, the mobile device 800 is able to communicate even when cradled in a wireless charging circuit.

In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9, the power management system 805 receives a battery voltage from the battery 808. The battery 808 can be any suitable battery for use in the mobile device 800, including, for example, a lithium-ion battery.

Applications

Some of the embodiments described above have provided examples in connection with mobile devices. However, the principles and advantages of the embodiments can be used for any other systems or apparatus that have needs for packaged RF components and modules including an electromagnetic shielding structure having an outer cobalt layer. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of forming a packaged radio frequency module, the method comprising:
   attaching at least one semiconductor die to a package substrate, the at least one semiconductor die including one or more radio frequency circuits;
   encapsulating the at least one semiconductor die in a molding compound; and
   forming an electromagnetic shielding structure including a top surface and outer side surfaces over the molding compound, including forming an outer layer that includes cobalt extending over the top surface but not over the outer side surfaces of the electromagnetic shielding structure.

2. The method of claim 1 wherein forming the electromagnetic shielding structure further includes sputtering cobalt in a first inner layer of the electromagnetic shielding structure, and sputtering copper in a second inner layer of the electromagnetic shielding structure, at least a portion of the second inner layer positioned between the first inner layer and the outer layer.

3. The method of claim 1 wherein forming the electromagnetic shielding structure further includes sputtering titanium in a first inner layer of the electromagnetic shielding structure, and sputtering copper in a second inner layer of the electromagnetic shielding structure, at least a portion of the second inner layer positioned between the first inner layer and the outer layer.

4. The method of claim 1 wherein forming the electromagnetic shielding structure includes forming the outer layer to provide electromagnetic shielding over a frequency range of at least 1 megahertz to 5 megahertz.

5. The method of claim 4 wherein forming the electromagnetic shielding structure includes forming the outer layer to provide electromagnetic shielding over a frequency range of at least 100 kilohertz to 5 megahertz.

6. The method of claim 1 wherein forming the electromagnetic shielding structure includes forming the outer layer to present a blue color.

7. The method of claim 1 wherein forming the electromagnetic shielding structure includes forming the outer layer to present a red-green-blue (RGB) value including a red component of about 0, a green component of about 71, and a blue component of about 171.

8. The method of claim 1 wherein forming the electromagnetic shielding structure includes forming the outer layer to have at least fifty percent cobalt by mass.

9. The method of claim 1 wherein forming the electromagnetic shielding structure includes forming the outer layer to have at least ninety percent cobalt by mass.

10. The method of claim 1 wherein forming the electromagnetic shielding structure includes forming a lid over the package substrate, the at least one semiconductor die positioned within the lid.

11. The method of claim 1 wherein forming the electromagnetic shielding structure includes forming a wire bond cage between the outer layer and the at least one semiconductor die.

12. A method of shielding a radio frequency component, the method comprising:
    forming an electromagnetic shielding structure including a top surface and outer side surfaces over a semiconductor die, including forming an outer layer that includes cobalt in an outer layer extending over the top surface but not over the outer side surfaces of the electromagnetic shielding structure.

13. The method of claim 12 wherein providing cobalt in the outer layer includes sputtering a cobalt layer on the electromagnetic shielding structure.

14. The method of claim 12 wherein forming the electromagnetic shielding structure further includes sputtering cobalt in a first inner layer of the electromagnetic shielding structure, and sputtering copper in a second inner layer of the electromagnetic shielding structure, at least a portion of the second inner layer positioned between the first inner layer and the outer layer.

15. The method of claim 12 wherein forming the electromagnetic shielding structure further includes sputtering titanium in a first inner layer of the electromagnetic shielding structure, and sputtering copper in a second inner layer of the electromagnetic shielding structure, at least a portion of the second inner layer positioned between the first inner layer and the outer layer.

16. The method of claim 12 wherein forming the electromagnetic shielding structure includes forming the outer layer to provide electromagnetic shielding over a frequency range of at least 1 megahertz to 5 megahertz.

17. The method of claim 16 wherein forming the electromagnetic shielding structure includes forming the outer layer to provide electromagnetic shielding over a frequency range of at least 100 kilohertz to 5 megahertz.

18. The method of claim 12 wherein forming the electromagnetic shielding structure includes forming the outer layer to present a blue color.

19. The method of claim 12 wherein forming the electromagnetic shielding structure includes forming the outer layer to present a red-green-blue (RGB) value including a red component of about 0, a green component of about 71, and a blue component of about 171.

20. The method of claim 12 wherein forming the electromagnetic shielding structure includes forming the outer layer to have at least fifty percent cobalt by mass.

21. The method of claim 12 wherein forming the electromagnetic shielding structure includes forming the outer layer to have at least ninety percent cobalt by mass.

22. The method of claim 12 wherein forming the electromagnetic shielding structure includes forming a lid over the package substrate, the semiconductor die positioned within the lid.

23. The method of claim 12 wherein forming the electromagnetic shielding structure includes forming a wire bond cage between the outer layer and the semiconductor die.

\* \* \* \* \*

UNITED STATES PATENT AND TRADEMARK OFFICE
CERTIFICATE OF CORRECTION

| | |
|---|---|
| PATENT NO. | : 11,563,267 B2 |
| APPLICATION NO. | : 17/303135 |
| DATED | : January 24, 2023 |
| INVENTOR(S) | : Anthony James LoBianco |

It is certified that error appears in the above-identified patent and that said Letters Patent is hereby corrected as shown below:

On the Title Page

Column 1, (Inventors), Lines 2-3: After "Nguyen," delete "Irvine, CA (US)" and insert
-- (Deceased) --.

Signed and Sealed this
Sixteenth Day of May, 2023

Katherine Kelly Vidal
*Director of the United States Patent and Trademark Office*